US011889736B2

(12) United States Patent
You

(10) Patent No.: US 11,889,736 B2
(45) Date of Patent: Jan. 30, 2024

(54) DISPLAY DEVICE CAPABLE OF PREVENTING A CRACK OF AN INORGANIC LAYER AND METHOD FOR FABRICATING THE SAME

(71) Applicant: Samsung Display Co., Ltd., Yongin-Si (KR)

(72) Inventor: Chungi You, Asan-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 47 days.

(21) Appl. No.: 17/214,999

(22) Filed: Mar. 29, 2021

(65) Prior Publication Data

US 2022/0077246 A1 Mar. 10, 2022

(30) Foreign Application Priority Data

Sep. 10, 2020 (KR) .......................... 10-2020-0116235

(51) Int. Cl.
*H10K 59/88* (2023.01)
*H10K 59/12* (2023.01)
*H10K 71/00* (2023.01)

(52) U.S. Cl.
CPC ............. *H10K 59/88* (2023.02); *H10K 59/12* (2023.02); *H10K 71/00* (2023.02)

(58) Field of Classification Search
CPC .............................. H01L 27/3223; G09F 9/301
See application file for complete search history.

(56) References Cited

U.S. PATENT DOCUMENTS

| 8,344,374 B2* | 1/2013 | Yamazaki | H01L 29/7869 438/149 |
| 8,471,256 B2* | 6/2013 | Yamazaki | H01L 27/1225 257/E29.117 |
| 8,581,625 B2* | 11/2013 | Yoneda | H03K 19/0008 326/38 |
| 8,816,349 B2* | 8/2014 | Yamazaki | H01L 29/7869 257/43 |
| 9,882,064 B2* | 1/2018 | Yamazaki | H01L 27/124 |
| 9,966,473 B2* | 5/2018 | Endo | H01L 29/78648 |
| 2015/0050758 A1* | 2/2015 | Ko | H10K 59/88 438/23 |
| 2016/0300900 A1* | 10/2016 | Miyake | G09G 3/3233 |
| 2016/0329392 A1* | 11/2016 | Miyake | G09G 3/3233 |
| 2016/0351641 A1* | 12/2016 | Ito | H10K 59/131 |
| 2018/0081219 A1* | 3/2018 | Kim | G06F 1/1652 |
| 2020/0105206 A1* | 4/2020 | Jo | H01L 27/3276 |
| 2022/0069042 A1* | 3/2022 | Jung | H01L 27/3258 |

FOREIGN PATENT DOCUMENTS

KR 10-2058699 B1 12/2019

* cited by examiner

*Primary Examiner* — Caleb E Henry
(74) *Attorney, Agent, or Firm* — Innovation Counsel LLP

(57) ABSTRACT

A display device may include a substrate including a display area and a bending area, a buffer layer disposed on the substrate, a first dummy pattern disposed in the bending area on the buffer layer; a first insulating layer disposed on the buffer layer, the first insulating layer exposing an upper surface of the first dummy pattern, a second insulating layer disposed on the first insulating layer, the second insulating layer having an opening exposing an upper surface of the first dummy pattern, a second dummy pattern disposed on the first dummy pattern, and a transmission line disposed on the second dummy pattern.

15 Claims, 13 Drawing Sheets

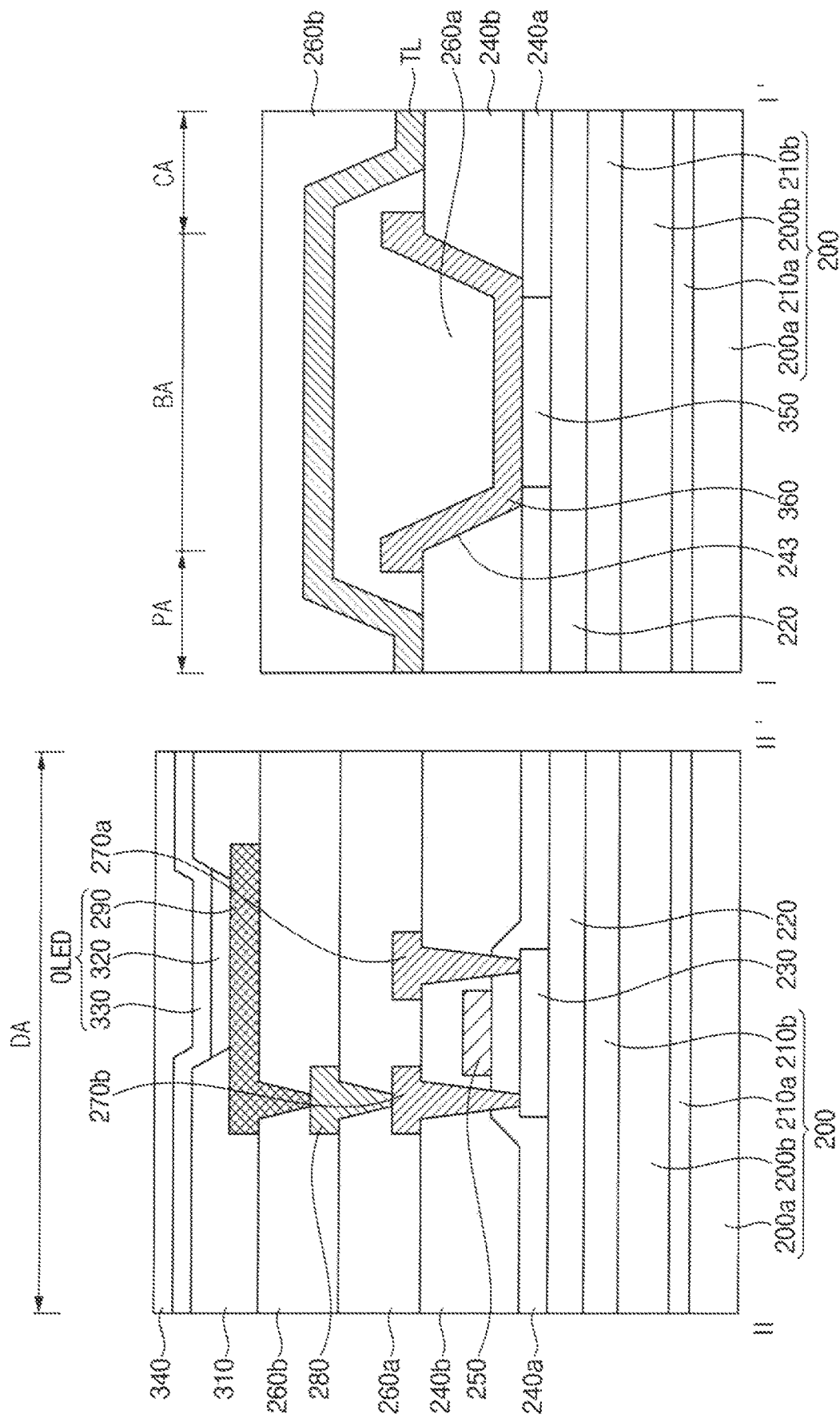

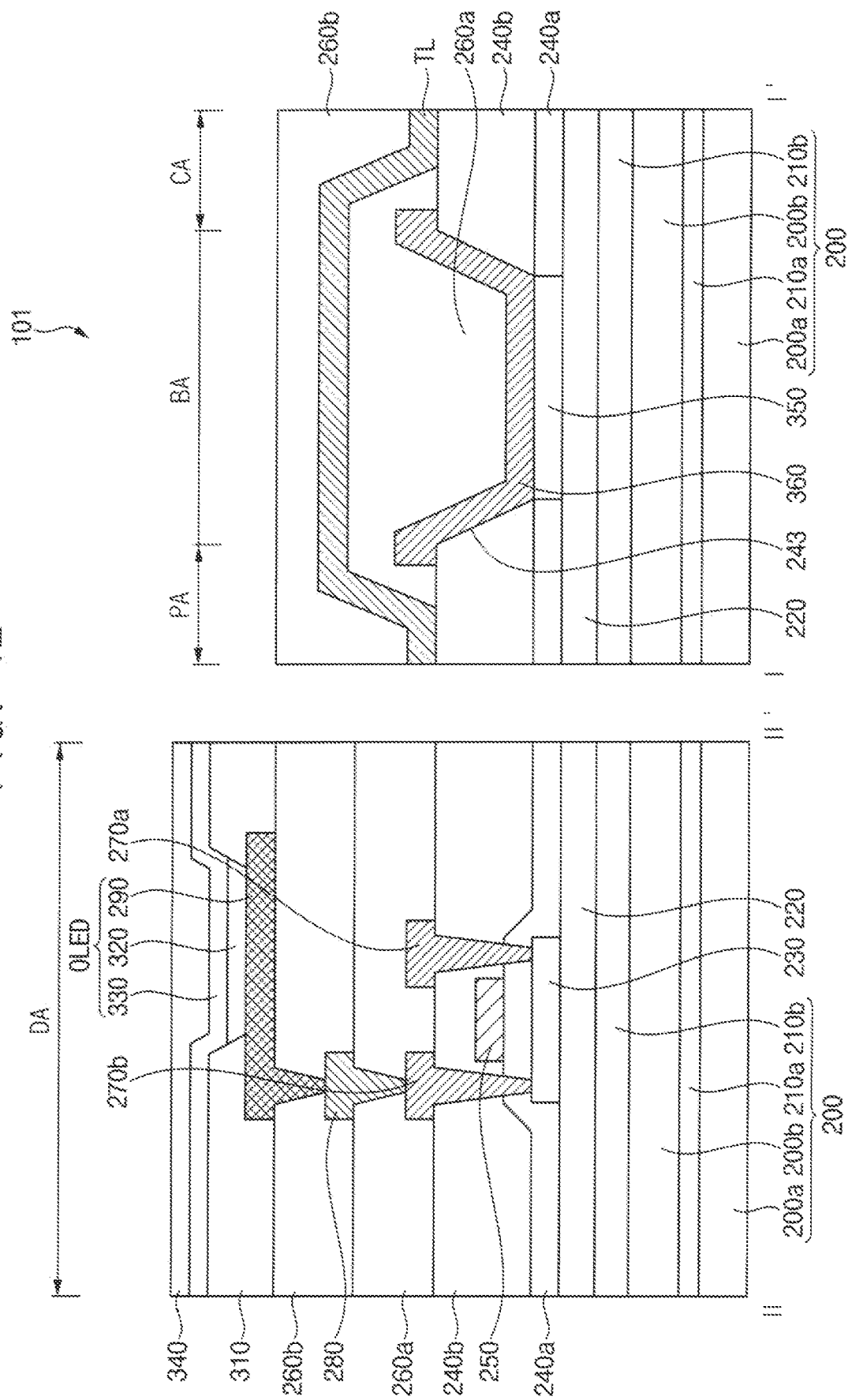

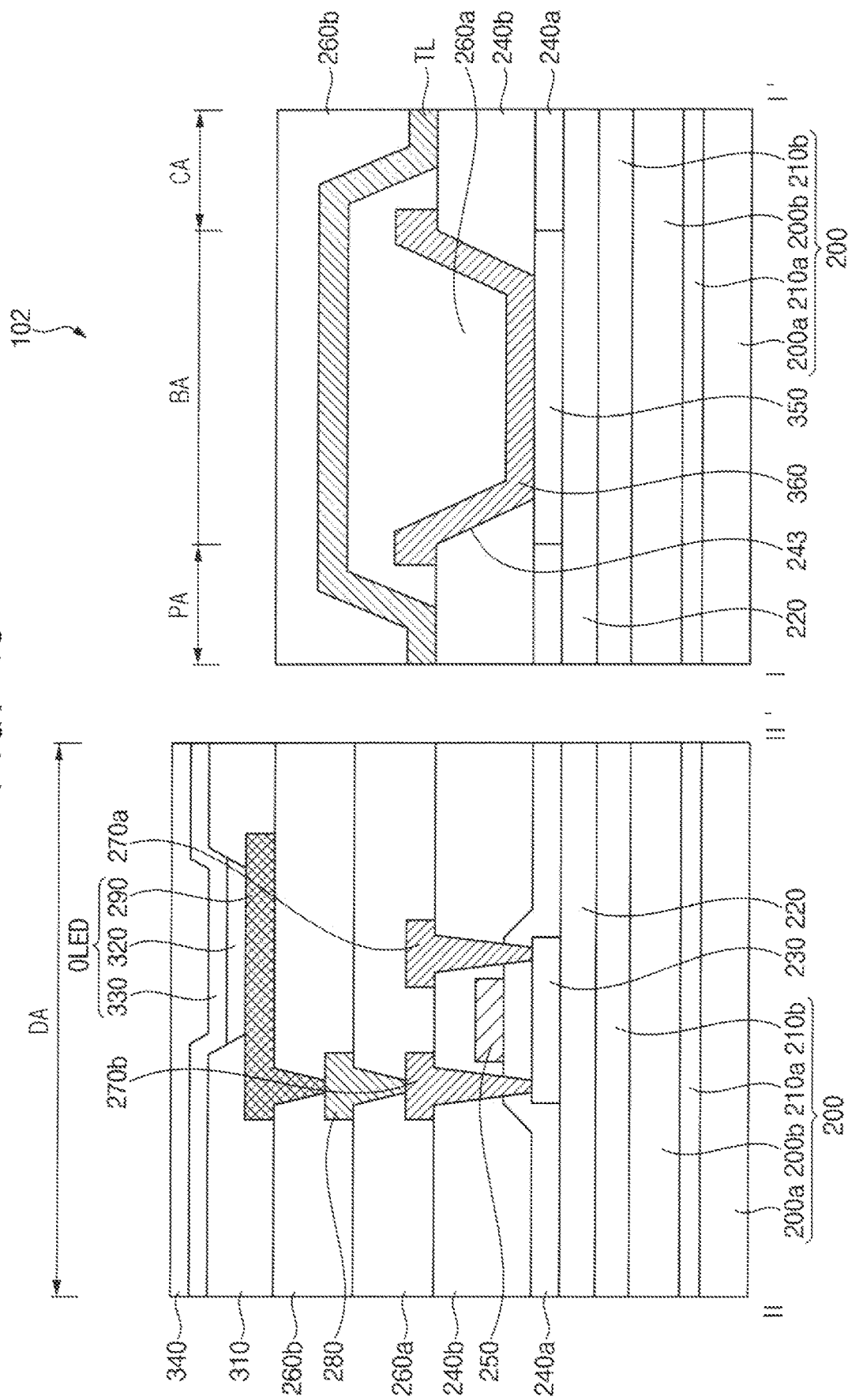

DISPLAY DEVICE CAPABLE OF PREVENTING A CRACK OF AN INORGANIC LAYER AND METHOD FOR FABRICATING THE SAME

CROSS-REFERENCE TO RELATED APPLICATION(S)

This application claims priority under 35 USC § 119 to Korean Patent Application No. 10-2020-0116235 filed on Sep. 10, 2020 in the Korean Intellectual Property Office (KIPO), the entire disclosure of which is incorporated by reference herein.

BACKGROUND

1. Field

Embodiments relate to a display device and a method for fabricating the same, more particularly, embodiments relate to a display device including a bending area and a method for fabricating the same.

2. Description of the Related Art

An organic light emitting display device may include a flexible base substrate formed of a polymer, or the like. The display panel including the flexible base substrate may be designed to have a bending area, and in order to prevent a crack of an inorganic layer due to bending stress applied to the bending area, a mask process of removing the inorganic layer may be additionally performed in the bending area. In this case, as the number of mask processes increases, a manufacturing cost of the organic light emitting display device may increase.

Recently, in order to reduce the manufacturing cost of the organic light emitting display device, the organic light emitting display device, which includes an inorganic layer formed in a bending area, has been developed with no additional mask process of removing the inorganic layer formed in the bending area. However, when the inorganic layer remains in the bending area, the bending area may become vulnerable to cracks.

SUMMARY

Embodiments provide a display device including a bending area.

Embodiments provide a method for fabricating the display device including the bending area.

A display device according to an embodiment may include a substrate including a display area and a bending area, a buffer layer disposed on the substrate, a first dummy pattern disposed in the bending area on the buffer layer, a first insulating layer disposed on the buffer layer, the first insulating layer exposing an upper surface of the first dummy pattern, a second insulating layer disposed on the first insulating layer, the second insulating layer having an opening exposing an upper surface of the first dummy pattern, a second dummy pattern disposed on the first dummy pattern, and a transmission line disposed on the second dummy pattern.

In embodiments, the substrate may include a first organic film, a first barrier layer disposed on the first organic film, a second organic film disposed on the first barrier layer, and a second barrier layer disposed on the second organic film.

In embodiments, the display device may further include a source electrode and a drain electrode disposed in the display area on the second insulating layer. A material included in the second dummy pattern is identical to a material included in each of the source and drain electrodes.

In embodiments, the second dummy pattern may contact an upper surface of the first dummy pattern.

In embodiments, the substrate may further include a peripheral area disposed between the display area and the bending area, and a connection area disposed adjacent to the bending area. The second dummy pattern extends from an edge of the peripheral area to an edge of the connection area.

In embodiments, the display device may further include a first organic layer disposed on the second dummy pattern.

In embodiments, the display device may further include a second organic layer disposed on the transmission line.

In embodiments, the display device may further include a lower electrode disposed in the display area on the second organic layer, an emission layer disposed on the lower electrode, and an upper electrode disposed on the emission layer.

In embodiments, the display device may further include an active layer disposed in the display area on the buffer layer. A material included in the first dummy pattern is identical to a material included in the active layer.

In embodiments, the first dummy pattern may include a silicon semiconductor.

In embodiments, the first dummy pattern may include polysilicon.

A method for fabricating the display device according to an embodiment may include providing a substrate including a display area and a bending area, forming a buffer layer on the substrate, forming a first dummy pattern in the bending area on the buffer layer, forming a first insulating layer covering the first dummy pattern on the buffer layer, forming a second insulating layer on the first insulating layer, exposing an upper surface of the first dummy pattern by removing each of the first and second insulating layers, forming a second dummy pattern on the first dummy pattern, and forming a transmission line on the second dummy pattern.

In embodiments, the substrate may include a first organic film, a first barrier layer disposed on the first organic film, a second organic film disposed on the first barrier layer, and a second barrier layer disposed on the second organic film.

In embodiments, the method further may include forming a source electrode and a drain electrode in the display area on the first insulating layer. A material included in the second dummy pattern is identical to a material included in each of the source and drain electrodes.

In embodiments, the second dummy pattern may contact an upper surface of the first dummy pattern.

In embodiments, the substrate may further include a peripheral area disposed between the display area and the bending area, and a connection area disposed adjacent to the bending area. The second dummy pattern extends from an edge of the peripheral area to an edge of the connection area.

In embodiments, the method further may include forming a first organic layer on the second dummy pattern, and forming a second organic layer on the transmission line.

In embodiments, the method further may include forming an active layer in the display area on the buffer layer. A material included in the first dummy pattern is identical to a material included in the active layer.

In embodiments, the first dummy pattern may include a silicon semiconductor.

In embodiments, the first dummy pattern may include polysilicon.

A display device according to embodiments, a first dummy pattern including polysilicon may be disposed in a bending area on a buffer layer and a second dummy pattern may be disposed to contact the exposed upper surface of the first dummy pattern.

Accordingly, the propagation of the crack occurring in the inorganic layer to the transmission line may be blocked.

A method for fabricating the display device according to embodiments, a mask process of removing an inorganic layer from a bending area may be omitted, a first dummy pattern including polysilicon may be formed in the bending area on the buffer, and a second dummy pattern may be formed to contact the exposed upper surface of the first dummy pattern. Accordingly, the manufacturing cost of the display device may be reduced.

A display device according to an embodiment may include a substrate including a display area and a non-display area; a buffer layer disposed on the substrate in the display area and the non-display area; a first dummy pattern disposed in the non-display area on the buffer layer, the first dummy pattern being electrically floated; a first insulating layer disposed on the buffer layer, the first insulating layer exposing an upper surface of the first dummy pattern; a second insulating layer disposed on the first insulating layer, the second insulating layer having an opening exposing the upper surface of the first dummy pattern; a second dummy pattern disposed on the first dummy pattern; and a transmission line disposed on the second dummy pattern.

In embodiments, the display device may further include a thin film transistor. The thin film transistor may include a active layer, a gate electrode overlapping the active layer with the first insulating layer disposed between the active layer and the gate electrode, and a source electrode and a drain electrode connected to the active layer via contact holes formed through the first insulating layer and the second insulating layer. The first dummy pattern may be disposed on a same layer as the active layer and formed of a same material as the active layer.

The second dummy pattern may directly contact the first dummy pattern.

The second dummy pattern may be disposed on a same layer as the source electrode and the drain electrode and formed of a same material as the source electrode and the drain electrode.

BRIEF DESCRIPTION OF THE DRAWINGS

Illustrative, non-limiting embodiments will be more clearly understood from the following detailed description taken in conjunction with the accompanying drawings.

FIGS. 5, 6, 7, 8, 9, 10, and 11 are cross-sectional views illustrating a method for fabricating a display device according to an embodiment.

FIG. 12 is a cross-sectional view taken along lines I-I' and II-II' corresponding to another example of the display device of FIG. 1.

FIG. 13 is a cross-sectional view taken along lines I-I' and II-II' corresponding to still another example of the display device of FIG. 1.

DETAILED DESCRIPTION OF THE EMBODIMENTS

Hereinafter, display devices and methods for fabricating display devices in accordance with embodiments will be explained in detail with reference to the accompanying drawings.

Figure 1:
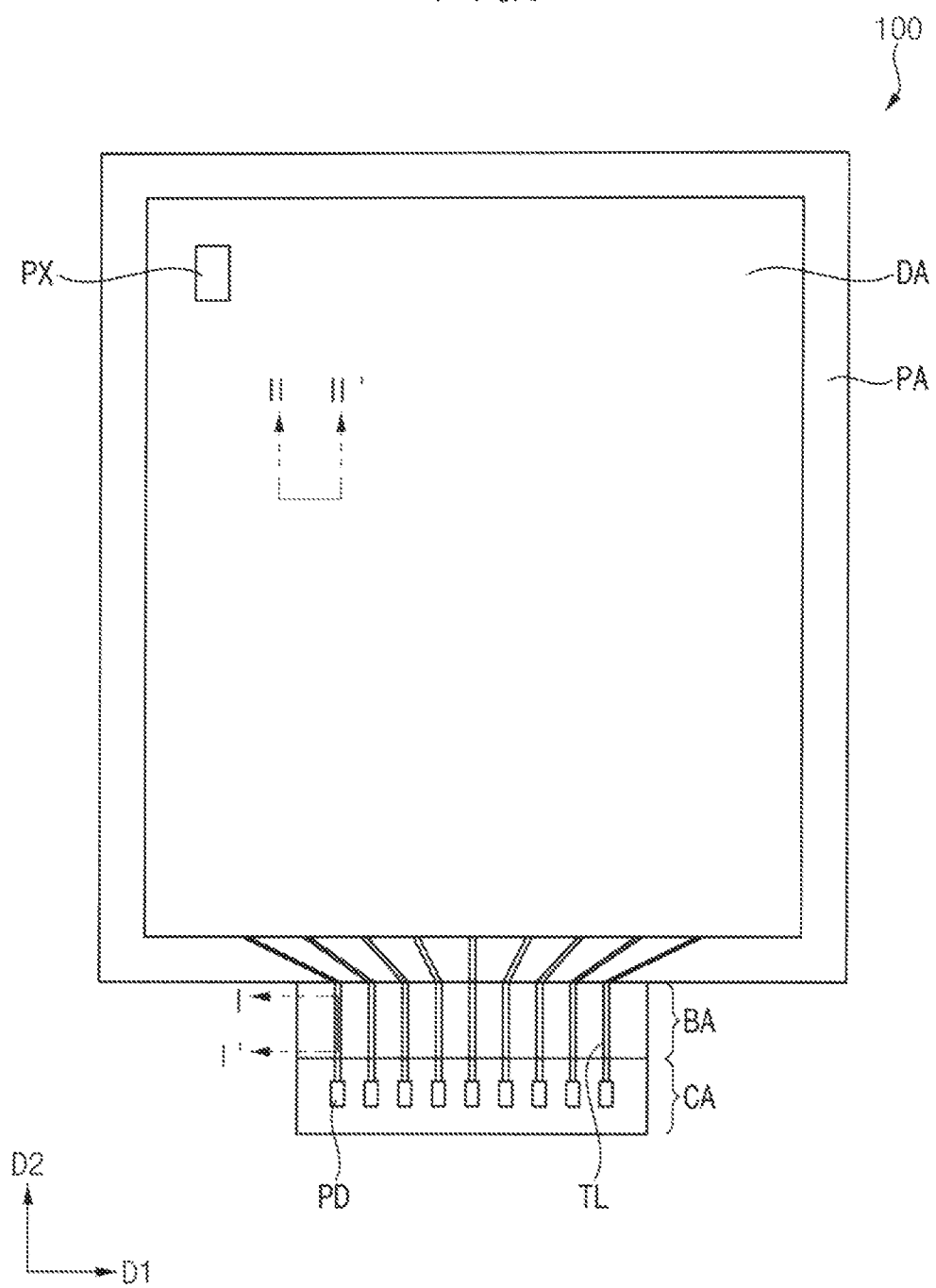
FIG. 1 is a plan view illustrating a display device according to an embodiment.
Figure 2:
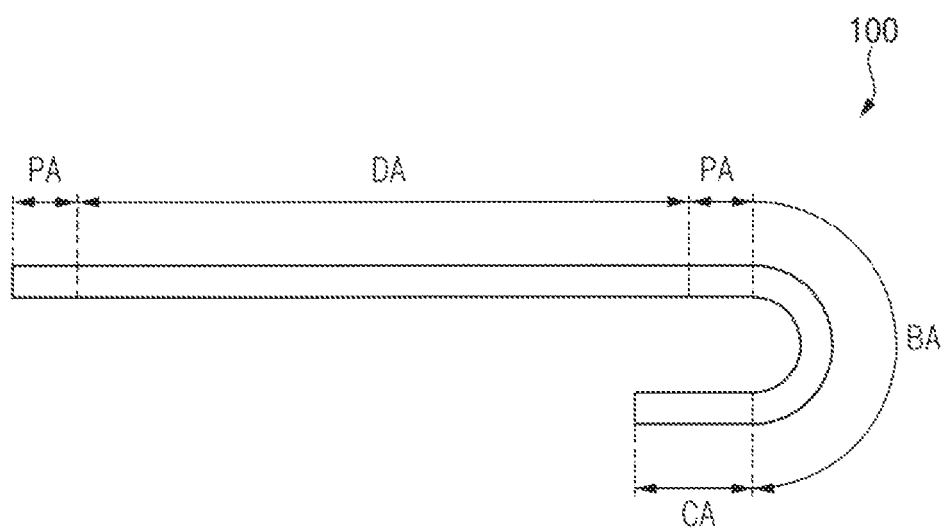
FIG. 2 is a cross-sectional view illustrating a display device according to an embodiment.

FIG. 1 is a plan view illustrating a display device according to an embodiment. FIG. 2 is a cross-sectional view illustrating a display device according to an embodiment. FIG. 1 may show an unfolded state to show a bending area and a connection area in a plan view.

Referring to FIGS. 1 and 2, the display device 100 may include a display area DA and a peripheral area PA adjacent to the display area DA. The display area DA may include a plurality of pixel areas PX. According to an embodiment, a light emitting element and a driving element electrically connected to the light emitting element may be disposed in each pixel area PX. In FIG. 1, the peripheral area PA may surround at least a part of the display area DA.

The display device 100 may further include a bending area BA and a connection area CA. The bending area BA may extend form one side of the peripheral area PA and may be bent downward. In other words, the bending area BA is bent along the first direction D1 so that the connection area CA may be positioned on the bottom surface of the display device. The connection area CA may extend from the bending area BA and may be disposed under the display area DA or the peripheral area PA. As illustrated in FIG. 1, when the display device 100 is unfolded, the bending area BA may be disposed between the peripheral area PA and the connection area CA.

In the connection area CA, connection pads PD to which a driving signal or a power voltage provided from a driving device is applied may be disposed. The connection pads PD may be electrically connected to the driving device. The connection pads PD may be electrically connected to the transmission lines TL connecting the connection pads PD to the pixels in the plurality of pixel areas PX. The transmission lines TL may be disposed in the connecting area CA, the bending area BA, and the peripheral area PA. The transmission lines TL may transmit a driving signal or a power voltage to the light emitting element and the driving element disposed in the pixel area PX of the display area DA or may transmit a driving signal to a driving circuit (e.g., a driving integrated circuit) disposed in the peripheral area PA (or the connection area CA).

Figure 3:
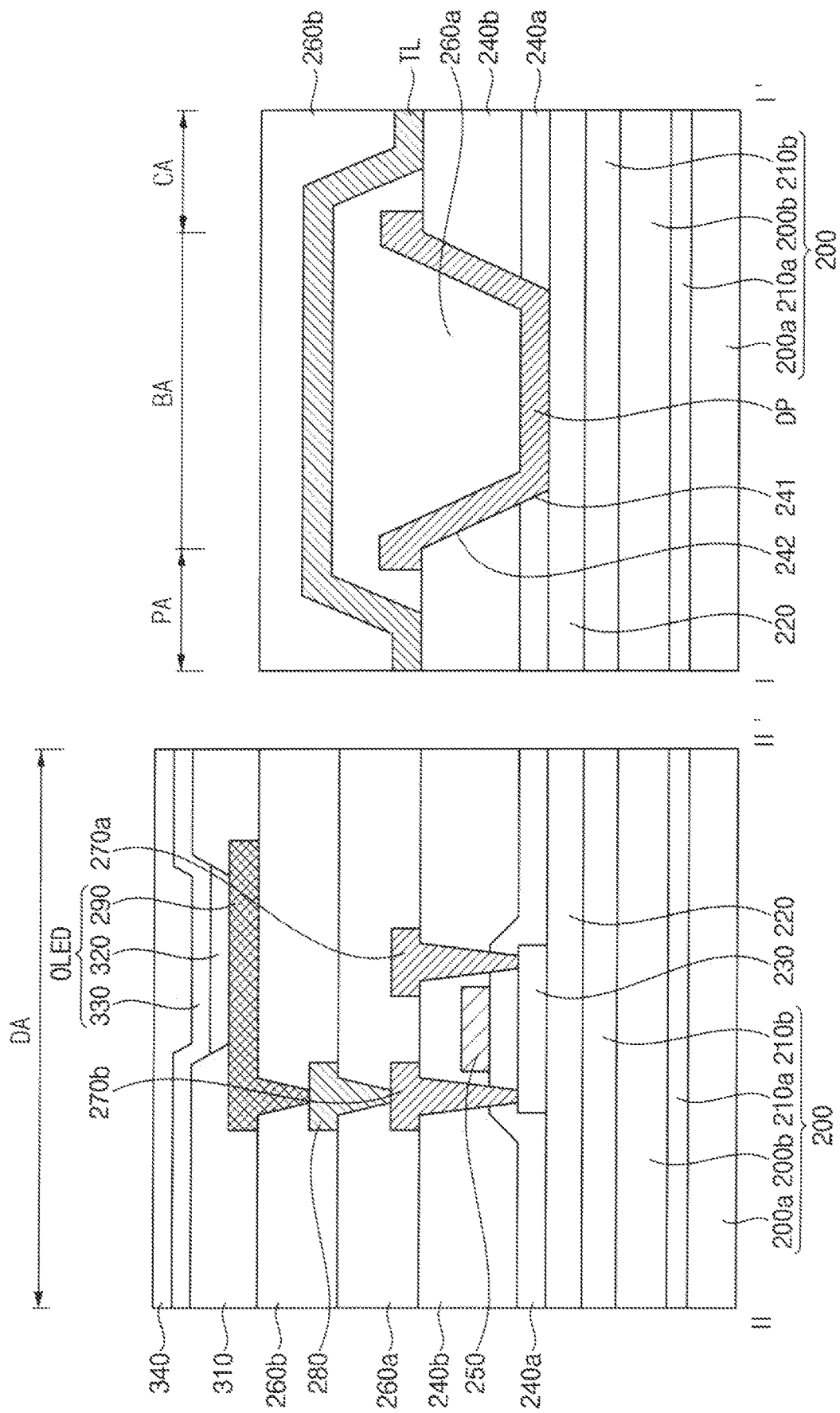
FIG. 3 is a cross-sectional view illustrating a conventional display device.

FIG. 3 is a cross-sectional view illustrating a conventional display device.

Referring to FIG. 3, the display device may include a first organic film 200*a*, a second organic film 200*b*, a first barrier layer 210*a*, a second barrier layer 210*b*, a buffer layer 220, an active layer 230, a gate electrode 250, a first insulating layer 240*a*, a second insulating layer 240*b*, a source electrode 270*a*, a drain electrode 270*b*, a connection electrode 280, a first organic layer 260*a*, a second organic layer 260*b*, a lower electrode 290, a pixel defining layer 310, an upper electrode 330, a light emitting layer 320, an encapsulation layer 340, a dummy pattern DP, a transmission line TL, and the like.

A substrate 200 including the display area DA, the peripheral area PA adjacent to the display area DA, the bending area BA adjacent to the peripheral area PA, and the connection area CA adjacent to the bending area BA may include the first organic film 200a, the first barrier layer 210a, the second organic film 200b, and the second barrier layer 210b.

The buffer layer 220, the first insulating layer 240a, and the second insulating layer 240b may be disposed on the substrate 200. According to an embodiment, a part of the upper surface of the buffer layer 220 positioned in the bending area BA may be exposed. The first insulating layer 240a positioned in the bending area BA may have a first opening 241 exposing the upper surface of the buffer layer 220, and the second insulating layer 240b positioned in the bending area BA may have a second opening 242 exposing the upper surface of the buffer layer 220.

The dummy pattern DP may be disposed in the bending area BA on the buffer layer 220. According to an embodiment, the dummy pattern DP may contact the upper surface of the buffer layer 220. The dummy pattern DP may extend into a part of the peripheral area PA and a part of the connection area CA. The dummy pattern DP may extend from the peripheral area PA disposed adjacent to the bending area BA to the connection area CA disposed adjacent to the bending area BA.

The first organic layer 260a, the transmission line TL, and the second organic layer 260b may be disposed on the dummy pattern DP.

When an inorganic layer is disposed on the substrate 200 in the bending area BA, the bending area BA may become vulnerable to stress. Accordingly, a crack may occur in the inorganic layer and the crack generated in the inorganic layer may propagate to the transmission line TL.

Figure 4:
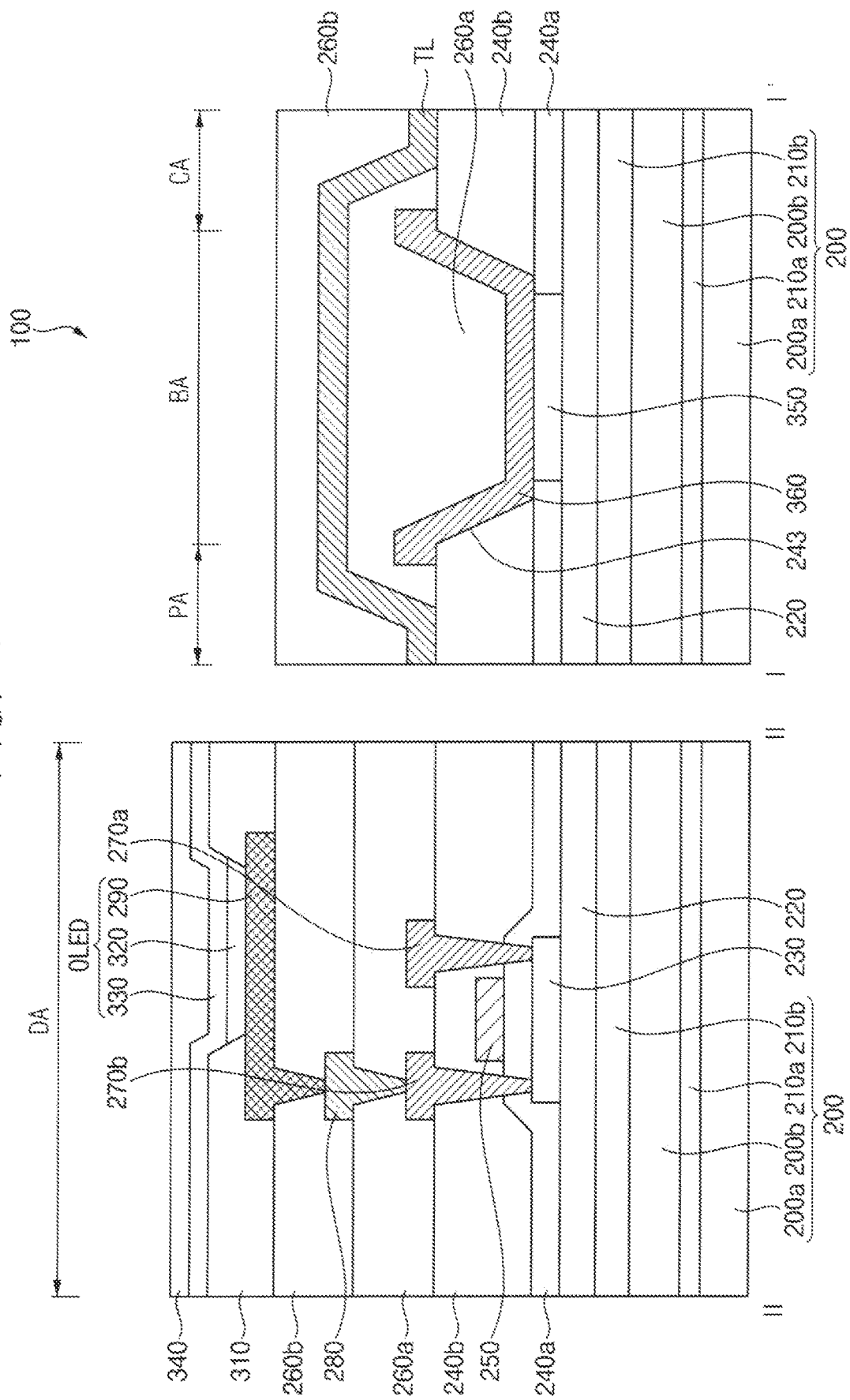
FIG. 4 is a cross-sectional view taken along lines I-I' and II-II' corresponding to an example of the display device of FIG. 1.

FIG. 4 is a cross-sectional view taken along lines I-I' and II-II' corresponding to an example of the display device of FIG. 1.

Referring to FIG. 4, the display device 100 may include the first organic film 200a, the second organic film 200b, the first barrier layer 210a, the second barrier layer 210b, the buffer layer 220, the active layer 230, the gate electrode 250, the first insulating layer 240a, the second insulating layer 240b, the source electrode 270a, the drain electrode 270b, the connection electrode 280, the first organic layer 260a, the second organic layer 260b, the lower electrode 290, the pixel defining layer 310, the upper electrode 330, the emission layer 320, the encapsulation layer 340, a first dummy pattern 350, a second dummy pattern 360, the transmission line TL, and the like.

The buffer layer 220 may be disposed on the substrate 200 including the display area DA, the bending area BA, the peripheral area PA disposed between the display area DA and the bending area BA, and a connection area CA disposed adjacent to the bending area BA. The buffer layer 220 may be entirely disposed in the display area DA, the peripheral area PA, the bending area BA, and the connection area CA. For example, the buffer layer 220 may include an inorganic material such as oxide or nitride. According to an embodiment, the buffer layer 220 may have a stacked structure in which a silicon oxide layer and a silicon nitride layer are stacked. Alternatively, the buffer layer 220 may have a single layer structure including a silicon oxide layer or a silicon nitride layer. The buffer layer 220 may prevent diffusion of metal atoms or impurities from the substrate 200 to a thin film transistor.

According to an embodiment, the substrate 200 may include the first organic film 200a, the first barrier layer 210a, the second organic film 200b, and the second barrier layer 210b. The first barrier layer 210a may be disposed on the first organic film 200a, the second organic film 200b may be disposed on the first barrier layer 210a, and the second barrier layer 210b may be disposed on the second organic film 200b.

Each of the first organic film 200a and the second organic film 200b may include at least one polymer film. For example, the polymer film may include polyethylene terephthalate, polyethylene naphthalate, polyether ketone, polycarbonate, polyarylate, polyether sulfone, polyimide, and the like.

Each of the first barrier layer 210a and the second barrier layer 210b may include an inorganic material. For example, each of the first barrier layer 210a and the second barrier layer 210b may include silicon oxide, silicon nitride, silicon oxynitride, and the like.

According to an embodiment, the first barrier layer 210a may have a stacked structure in which an amorphous silicon layer and a silicon oxide layer are stacked. Alternatively, the first barrier layer 210a may have a single layer structure including the silicon oxide layer.

According to an embodiment, the second barrier layer 210b may have a single layer structure including the silicon oxide layer.

According to an embodiment, a sum of a thickness of the buffer layer 220 and the thickness of the second barrier layer 210b may be about 7,000 Å or less.

The active layer 230 may be disposed in the display area DA on the buffer layer 220. The active layer 230 may include a silicon semiconductor or an oxide semiconductor. For example. The active layer 230 may include polysilicon. Alternatively, the active layer 230 may include indium (In), zinc (Zn), gallium (Ga), tin (Sn), titanium (Ti), aluminum (Al), hafnium (Hf), zirconium (Zr), magnesium (Mg) or combinations thereof. According to an embodiment, the active layer 230 may include polysilicon.

The first dummy pattern 350 may be disposed in the bending area BA on the buffer layer 220. According to an embodiment, the first dummy pattern 350 may include the same material as the active layer 230 disposed in the display area DA. That is, the first dummy pattern 350 may be disposed on the same layer as the active layer 230 disposed in the display area DA and may be formed at the same time as the active layer 230. The first dummy pattern 350 may include polysilicon. In addition, the first dummy pattern 350 may be electrically floated.

The first insulating layer 240a may be disposed on the buffer layer 220 on the active layer 230 and the first dummy pattern 350. The first insulating layer 240a may cover the active layer 230 located in the display area DA and the first dummy pattern 350 located in the bending area BA. That is, the first insulating layer 240a may be entirely disposed in the display area DA, the peripheral area PA, the bending area BA, and the connection area CA. For example, the first insulating layer 240a may include silicon oxide, silicon nitride, silicon carbide, and the like.

According to an embodiment, the first insulating layer 240a disposed in the bending area BA may expose the upper surface of the first dummy pattern 350.

The gate electrode 250 may be disposed in the display area DA on the first insulating layer 240a. The gate electrode 250 may be disposed to overlap the active layer 230. For example, the gate electrode 250 may include a metal such as aluminum (Al), silver (Ag), chromium (Cr), titanium (Ti), tantalum (Ta), molybdenum (Mo), etc., alloys thereof, nitrides thereof, a conductive metal oxide, a transparent conductive material, and the like.

The second insulating layer 240b may be disposed on the first insulating layer 240a on the gate electrode 250. The second insulating layer 240b may cover the gate electrode 250. That is, the second insulating layer 240b may be disposed in the display area DA, the peripheral area PA, the bending area BA, and the connection area CA. For example, the second insulating layer 240b may include silicon oxide, silicon nitride, silicon oxynitride, and the like. According to an embodiment, the second insulating layer 240b may be formed as a single layer including a single material.

According to an embodiment, the second insulating layer 240b disposed in the bending area BA may have an opening 243 exposing an upper surface of the first dummy pattern 350.

The source electrode 270a and the drain electrode 270b may be disposed in the display area DA on the second insulating layer 240b. The source electrode 270a and the drain electrode 270b may pass through the first insulating layer 240a and the second insulating layer 240b to be electrically connected to the active layer 230. For example, the source electrode 270a and the drain electrode 270b each may include a metal alloy, a metal nitride, a conductive metal oxide, a transparent conductive material, and the like.

The second dummy pattern 360 may be disposed on the first dummy pattern 350. The second dummy pattern 360 may directly contact the exposed upper surface of the first dummy pattern 350. Accordingly, the buffer layer 220 and the second dummy pattern 360 may be attached to each other via the first dummy pattern 350, thus adhesion between the buffer layer 220 and the second dummy pattern 360 may be strengthened, and the first dummy pattern 350 and the second dummy pattern 360 may block the propagation of the crack occurring in the inorganic layer to the transmission line TL.

A material included in the second dummy pattern 360 may be identical to a material included in each of the source electrode 270a and the drain electrode 270b and the second dummy pattern 360 may be formed at the same time as the source electrode 270a and the drain electrode 270b. That is, each of the second dummy pattern 360, the source electrode 270a and the drain electrode 270b may be disposed on the same layer. According to an embodiment, the second dummy pattern 360 may extend from an edge of the peripheral area PA that is disposed adjacent to the bending area BA to an edge of the connection area CA that is disposed adjacent to the bending area BA.

The first organic layer 260a may be disposed on the second insulating layer 240b on the source electrode 270a, the drain electrode 270b, and the second dummy pattern 360. The first organic layer 260a may be disposed in the display area DA, the peripheral area PA, the bending area BA, and the connection area CA. For example, the first organic layer 260a may include an organic insulating material such as phenol resin, acrylic resin, polyimide resin, polyamide resin, siloxane resin, epoxy resin, or the like.

The first organic layer 260a disposed in the display area DA may cover the source electrode 270a and the drain electrode 270b. The first organic layer 260a disposed in the bending area BA may cover the second dummy pattern 360. That is, the first organic layer 260a may cover the second dummy pattern 360 in the bending area BA.

The connection electrode 280 may be disposed in the display area DA on the first organic layer 260a. The connection electrode 280 may pass through the first organic layer 260a and may be electrically connected to the drain electrode 270b. For example, the connection electrode 280 may include a metal, an alloy, a metal nitride, a conductive metal oxide, a transparent conductive material, and the like.

The transmission line TL may be disposed in the bending area BA on the first organic layer 260a. The transmission line TL may extend from the peripheral area PA to the connection area CA. According to an embodiment, a material included in the transmission line TL and a material included in the connection electrode 280 may be the same. That is, the transmission line TL may be disposed on the same layer as the connection electrode 280 and may be formed at the same time as the connection electrode 280.

The second organic layer 260b may be disposed on the first organic layer 260a located in the display area DA on the connection electrode 280 and the transmission line TL disposed in the bending area BA, the peripheral area PA, and the connection area CA. That is, the second organic layer 260b may be entirely disposed in the display area DA except contact hole areas for the lower electrodes 290, the peripheral area PA, the bending area BA, and the connection area CA. For example, the second organic layer 260b may include an organic insulating material such as phenol resin, acrylic resin, polyimide resin, polyamide resin, siloxane resin, epoxy resin, or the like.

The lower electrode 290 may be disposed in the display area DA on the second organic layer 260b. The lower electrode 290 may pass through the second organic layer 260b and may be electrically connected to the connection electrode 280 through a contact hole.

The pixel defining layer 310 may be disposed on the lower electrode 290. The pixel defining layer 310 may have an opening exposing at least a part of the lower electrode 290. For example, the pixel defining layer 310 may include an organic insulating material.

The emission layer 320 may be disposed on the lower electrode 290. The emission layer 320 may include at least one functional layer of a hole injection layer, a hole transport layer, an electron transport layer, and an electron injection layer.

According to an embodiment, the emission layer 320 may emit red, green, or blue light. According to another embodiment, the emission layer 320 may emit white light. When the emission layer 320 emits white light, the emission layer 320 may include a multilayer structure including a red emission layer, a green emission layer, and a blue emission layer. Alternatively, the light emitting layer 320 may include a single layer structure including red, green, and blue light emitting materials.

The upper electrode 330 may be disposed on the emission layer 320 and the pixel defining layer 310. For example, the upper electrode 330 may include a metal, an alloy, a metal nitride, a metal fluoride, a conductive metal oxide, or a combination thereof. For example, the upper electrode 330 may continuously extend on the display area DA over the plurality of pixel areas PX shown in FIG. 1.

The encapsulation layer 340 may be disposed on the upper electrode 330. For example, the encapsulation layer 340 may have a stacked structure of an inorganic thin film and an organic thin film. The encapsulation layer 340 may prevent the lower electrode 290, the pixel defining layer 310, and the upper electrode 330 from deteriorating due to penetration of moisture or oxygen. In addition, the encapsulation layer 340 may also perform a function of protecting the lower electrode 290, the pixel defining layer 310, and the upper electrode 330 from external impact.

For example, the organic thin film may include a cured polymer such as polyacrylate, epoxy resin, silicone resin, etc. For example, the inorganic thin film may include silicon oxide, silicon nitride, silicon carbide, aluminum oxide, tantalum oxide, hafnium oxide, zirconium oxide, titanium oxide, or the like.

In the display device 100 according to an embodiment, the first dummy pattern 350 including polysilicon may be disposed in the bending area BA on the buffer layer 220, and the second dummy pattern 360 may be disposed to contact upper surface of the first dummy pattern 350. Accordingly, an adhesive strength between the second dummy pattern 360 and the buffer layer 220 may be strengthened through the first dummy pattern 350 disposed between the second dummy pattern 360 and the buffer layer 220. In addition, the first dummy pattern 350 and the second dummy pattern 360 may block the propagation of the crack generated in the inorganic layer to the transmission line TL and may minimize a concentration of a tensile stress on the transmission line TL.

FIGS. 5, 6, 7, 8, 9, 10, and 11 are cross-sectional views illustrating a method for fabricating a display device according to an embodiment.

Figure 5:
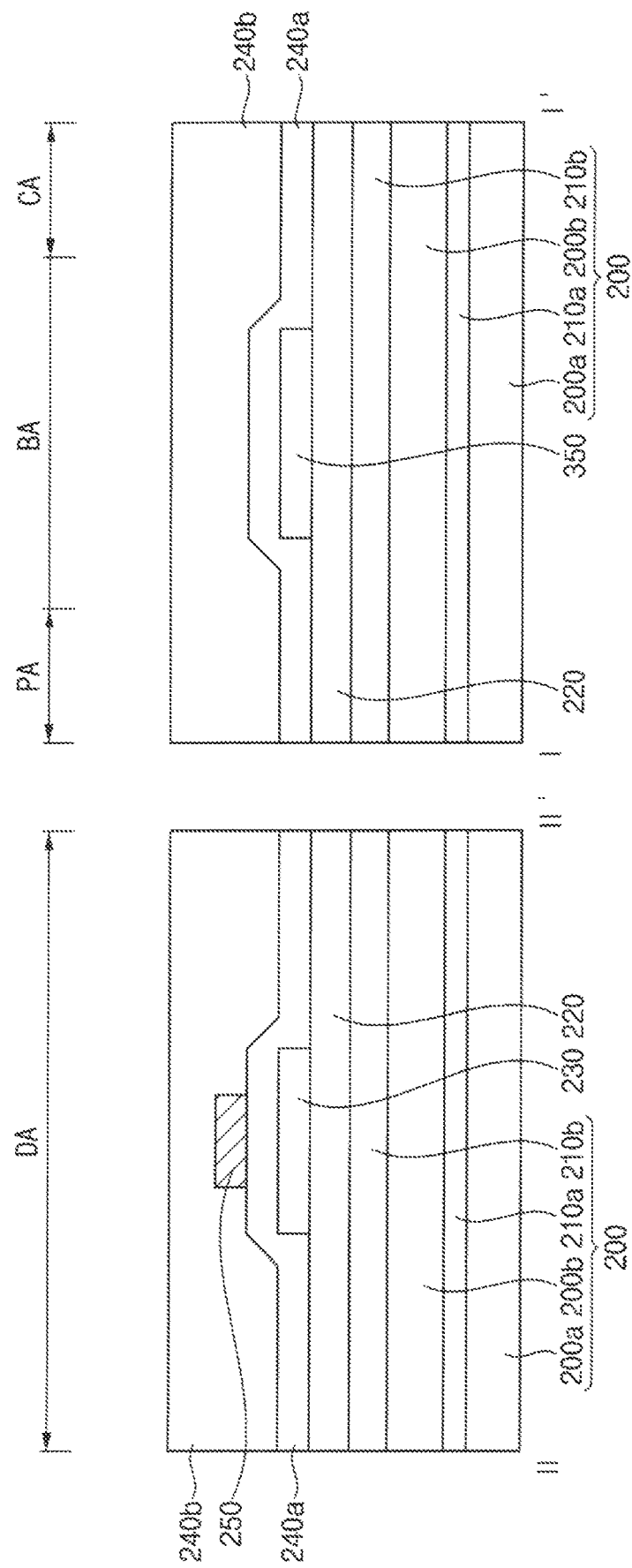

Referring to FIG. 5, the buffer layer 220 may be formed on the substrate 200 including the display area DA, the peripheral area PA disposed between the display area DA and the bending area BA, and a connection area CA disposed adjacent to the bending area BA. The buffer layer 220 may be entirely formed in the display area DA, the peripheral area PA, the bending area BA, and the connection area CA. The buffer layer 220 may prevent diffusion of metal atoms or impurities into the thin film transistor. For example, the buffer layer 220 may be formed using a silicon compound, a metal oxide, or the like. According to an embodiment, the buffer layer 220 may be formed in a stacked structure in which a silicon oxide layer and a silicon nitride layer are stacked. Alternatively, the buffer layer 220 may be formed in a single layer structure including a silicon oxide layer or a silicon nitride layer.

The substrate 200 may include the first organic film 200a, the first barrier layer 210a, the second organic film 200b, and the second barrier layer 210b. According to an embodiment, the first barrier layer 210a may be formed on the first organic film 200a, the second organic film 200b may be formed on the first barrier layer 210a, the second barrier layer 210b may be formed on the second organic film 200b. For example, each of the first organic film 200a and the second organic film 200b may be formed using polyimide, and each of the first barrier layer 210a and the second barrier layer 210b may be formed using an inorganic material. For example, each of the first barrier layer 210a and the second barrier layer 210b may be formed using silicon oxide, silicon nitride, silicon oxynitride, and the like.

According to an embodiment, the first barrier layer 210a may be formed in a stacked structure in which an amorphous silicon layer and a planar layer are stacked. Alternatively, the first barrier layer 210a may be formed in a single layer structure including a silicon oxide layer.

According to an embodiment, the second barrier layer 210b may be formed in a single layer structure including a silicon oxide layer.

The active layer 230 may be formed in the display area DA on the buffer layer 220. The active layer 230 may be formed using a silicon semiconductor or an oxide semiconductor. According to an embodiment, the active layer 230 may be formed using polysilicon. For example, after forming an amorphous silicon layer on the buffer layer 220, the amorphous silicon layer may be crystallized to form a polycrystalline silicon layer.

For example, the amorphous silicon layer may be formed by sputtering, low-pressure chemical vapor deposition ("LPCVD"), plasma-enhanced chemical vapor deposition ("PECVD"), or the like. The amorphous silicon layer may be crystallized by excimer laser annealing, sequential lateral solidification, or the like.

The polycrystalline silicon layer may be patterned by photolithography or the like to form a semiconductor pattern.

The first dummy pattern 350 may be formed in the bending area BA on the buffer layer 220. The first dummy pattern 350 may be formed using the same material as the active layer 230. That is, the first dummy pattern 350 may be formed on the same layer as the active layer 230 and may be formed at the same time as the active layer 230. The first dummy pattern 350 may be formed using polysilicon.

The first insulating layer 240a may be formed on the buffer layer 220 on the active layer 230 and the first dummy pattern 350. The first insulating layer 240a may be entirely formed in the display area DA, the peripheral area PA, the bending area BA, and the connection area CA. For example, the first insulating layer 240a may be formed using a silicon compound, a metal oxide, and the like.

The gate electrode 250 may be formed in the display area DA on the first insulating layer 240a. The gate electrode 250 may be formed to overlap the active layer 230. For example, the gate electrode 250 may be formed using a metal, an alloy, a metal nitride, a conductive metal oxide, a transparent conductive material, and the like.

The second insulating layer 240b may be formed on the first insulating layer 240a on the gate electrode 250. The second insulating layer 240b may be formed to cover the gate electrode 250. The second insulating layer 240b may be entirely formed in the display area DA, the peripheral area PA, the bending area BA, and the connection area CA. For example, the second insulating layer 240b may be formed using a silicon compound, a metal oxide, and the like.

Figure 6:
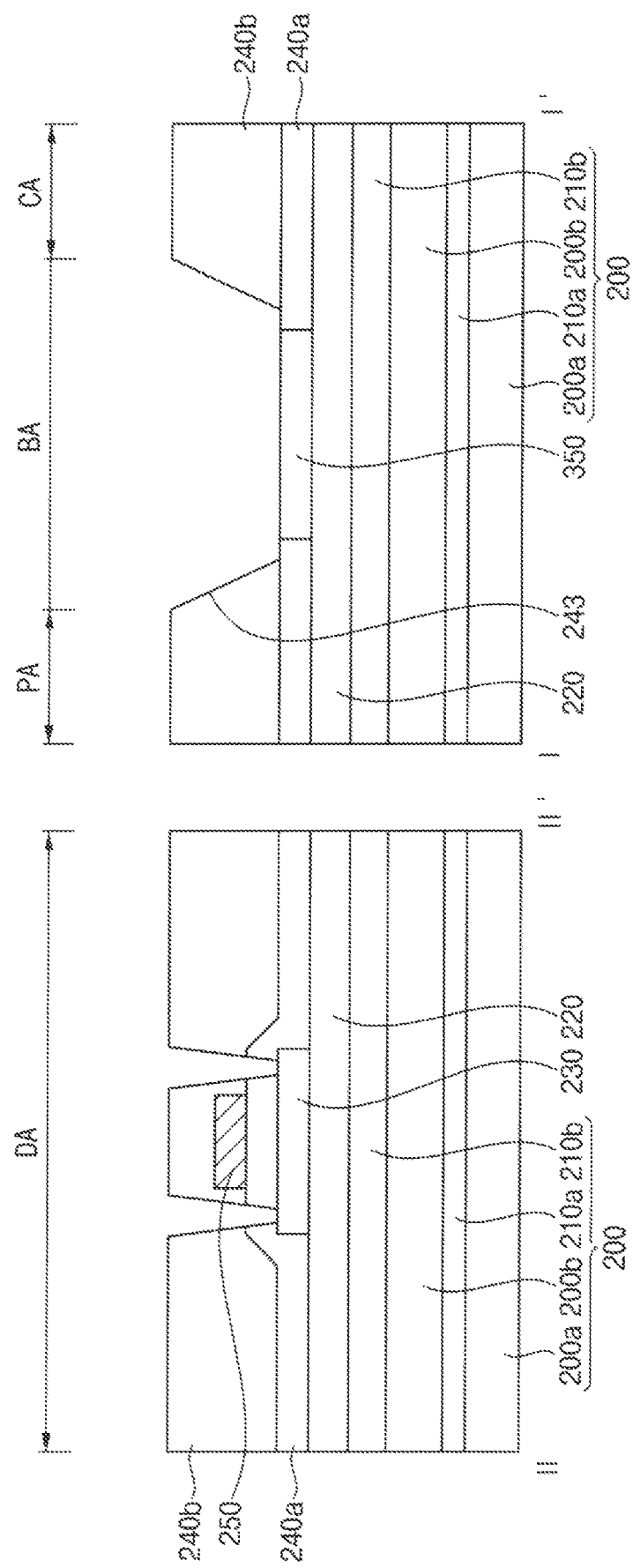

Referring to FIG. 6, a contact hole exposing the active layer 230 may be formed by removing parts of the first insulating layer 240a and the second insulating layer 240b disposed in the display area DA, respectively.

The upper surface of the first dummy pattern 350 may be exposed by removing parts of the first insulating layer 240a disposed in the bending area BA on the first dummy pattern 350 and the second insulating layer 240b disposed in the bending area BA on the first dummy pattern 350, respectively. Accordingly, the first insulating layer 240a may expose the upper surface of the first dummy pattern 350, and the second insulating layer 240b may have an opening 243 exposing the upper surface of the first dummy pattern 350.

According to an embodiment, the step of exposing the upper surface of the first dummy pattern 350 by removing parts of the first insulating layer 240a disposed in the bending area BA and the second insulating layer 240b disposed in the bending area BA, respectively, may be performed simultaneously with the step of forming the contact hole by removing parts of the first insulating layer 240a disposed in the display area DA and the second insulating layer 240b disposed in the display area DA, respectively. In FIG. 6, the opening 243 exposes the upper surface of the first dummy pattern 350 and the first insulating layer 240a. However, referring to FIGS. 12 and 13, the opening 243 may only expose the upper surface of the first dummy pattern 350 and may not expose the upper surface of the first insulating layer 240a.

Figure 7:
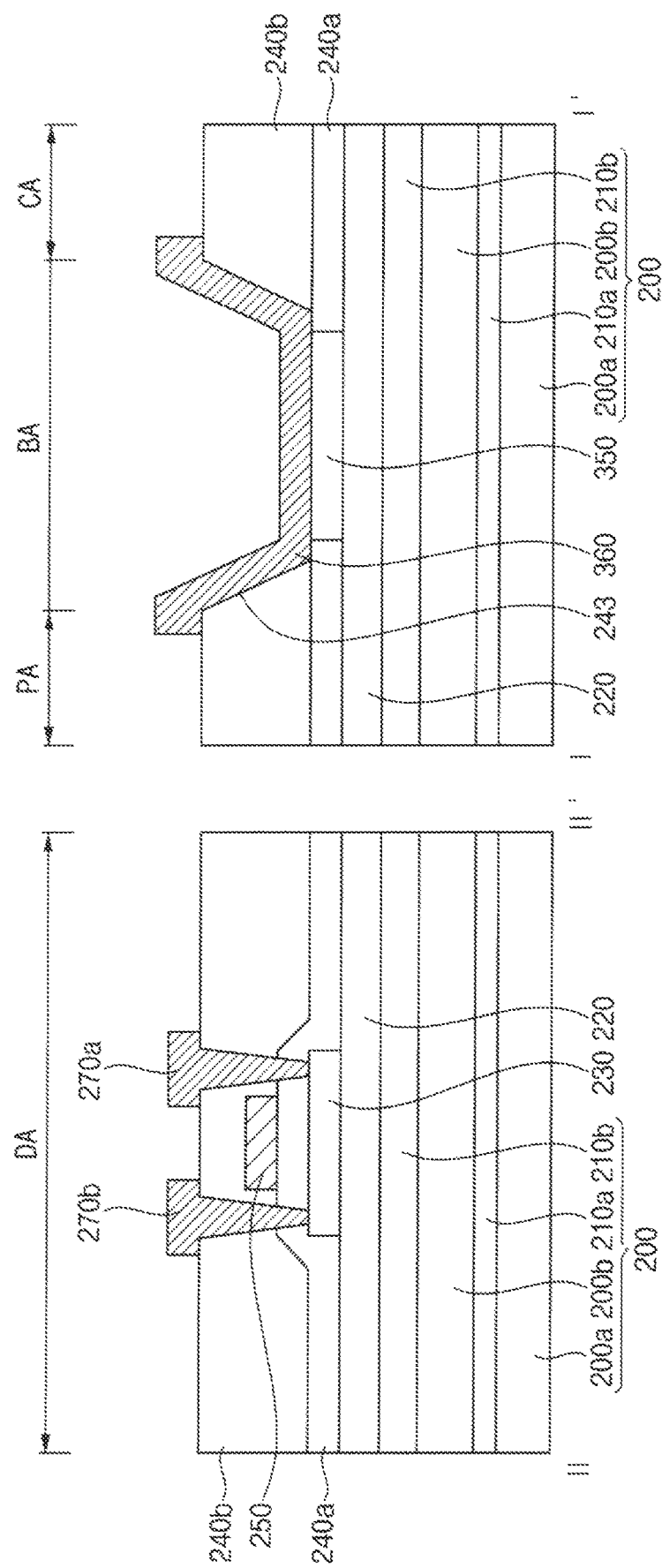

Referring to FIG. 7, the source electrode 270a and the drain electrode 270b may be formed in the display area DA on the second insulating layer 240b. The source electrode 270a and the drain electrode 270b fill the contact holes formed in the first insulating layer 240a and the second insulating layer 240b and may be electrically connected to the active layer 230. For example, each of the source electrode 270a and the drain electrode 270b may be formed using a metal alloy, a metal nitride, a conductive metal oxide, a transparent conductive material, and the like.

The second dummy pattern 360 may be formed in the bending area BA on the first dummy pattern 350 and the second insulating layer 240b. The second dummy pattern 360 may extend from an edge of the peripheral area PA to an edge of the connection area CA disposed adjacent to the bending area BA. The second dummy pattern 360 may be formed in direct contact with the exposed upper surface of the first dummy pattern 350. For example, the second dummy pattern 360 may be simultaneously formed using the same material as each of the source electrode 270a and the drain electrode 270b. That is, the second dummy pattern 360 may be formed on the same layer as each of the source electrode 270a and the drain electrode 270b.

Figure 8:
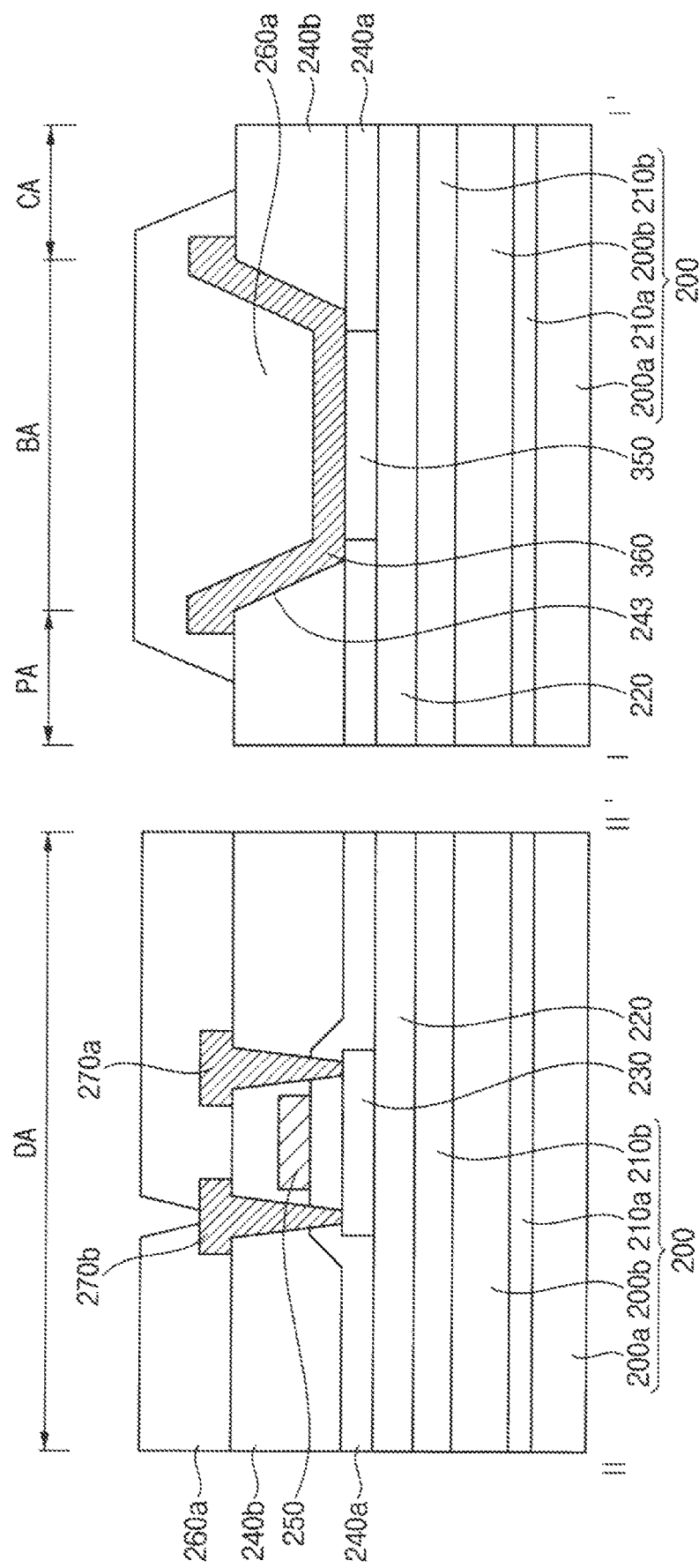

Referring to FIG. 8, the first organic layer 260a may be formed on the second insulating layer 240b.

The first organic layer 260a disposed in the display area DA may be formed to cover the source electrode 270a and the drain electrode 270b. The first organic layer 260a may be formed in the display area DA, the peripheral area PA, the bending area BA, and the connection area CA. The first organic layer 260a may be formed to cover the second dummy pattern 360. That is, the first organic layer 260a may be formed on the second dummy pattern 360 exposed in the bending area BA. For example, the first organic layer 260a may include an organic insulating material such as phenol resin, acrylic resin, polyimide resin, polyamide resin, siloxane resin, epoxy resin, etc. The first organic layer 260a in the display area DA, the peripheral area PA, the bending area BA, and the connection area CA may be patterned using a conventional photolithograph technology to form a drain contact hole in the display area DA and a first organic layer 260a in the peripheral area PA, the bending area BA, and the connection area CA, respectively.

Figure 9:
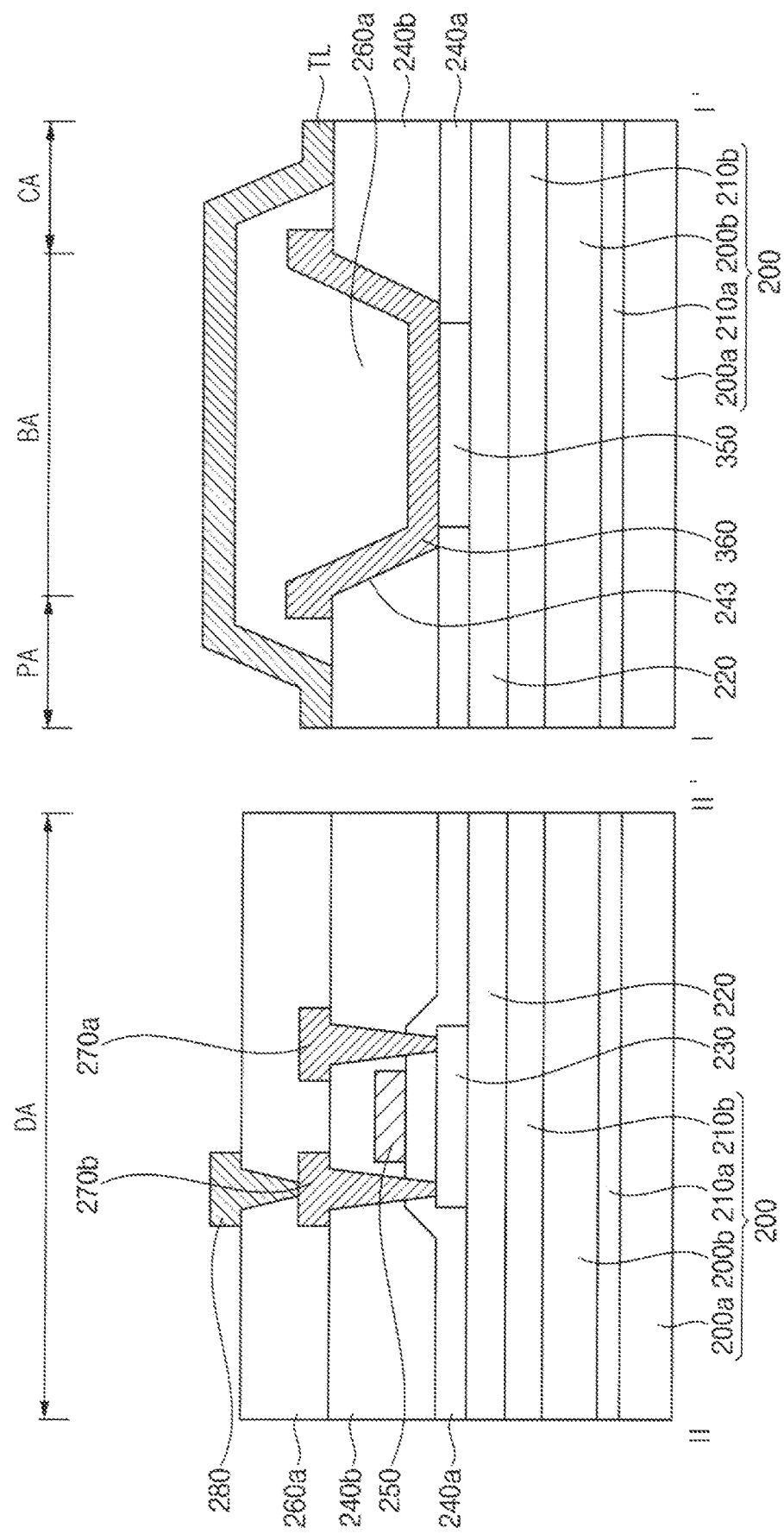

Referring to FIG. 9, the connection electrode 280 may be formed in the display area DA on the first organic layer 260a. The connection electrode 280 fills the drain contact hole and may be electrically connected to the drain electrode 270b. For example, the connection electrode 280 may include a metal, an alloy, a metal nitride, a conductive metal oxide, a transparent conductive material, and the like.

The transmission line TL may be formed in the bending area BA on the first organic layer 260a. The transmission line TL may be formed to extend from an edge of the peripheral area PA to an edge of the connection area CA disposed adjacent to the bending area BA. For example, the transmission line TL may include a metal, an alloy, a metal nitride, a conductive metal oxide, a transparent conductive material, and the like. That is, the transmission line TL may be simultaneously formed using the same material as the connection electrode 280, and the transmission line TL may be formed on the same layer as the connection electrode 280.

Figure 10:
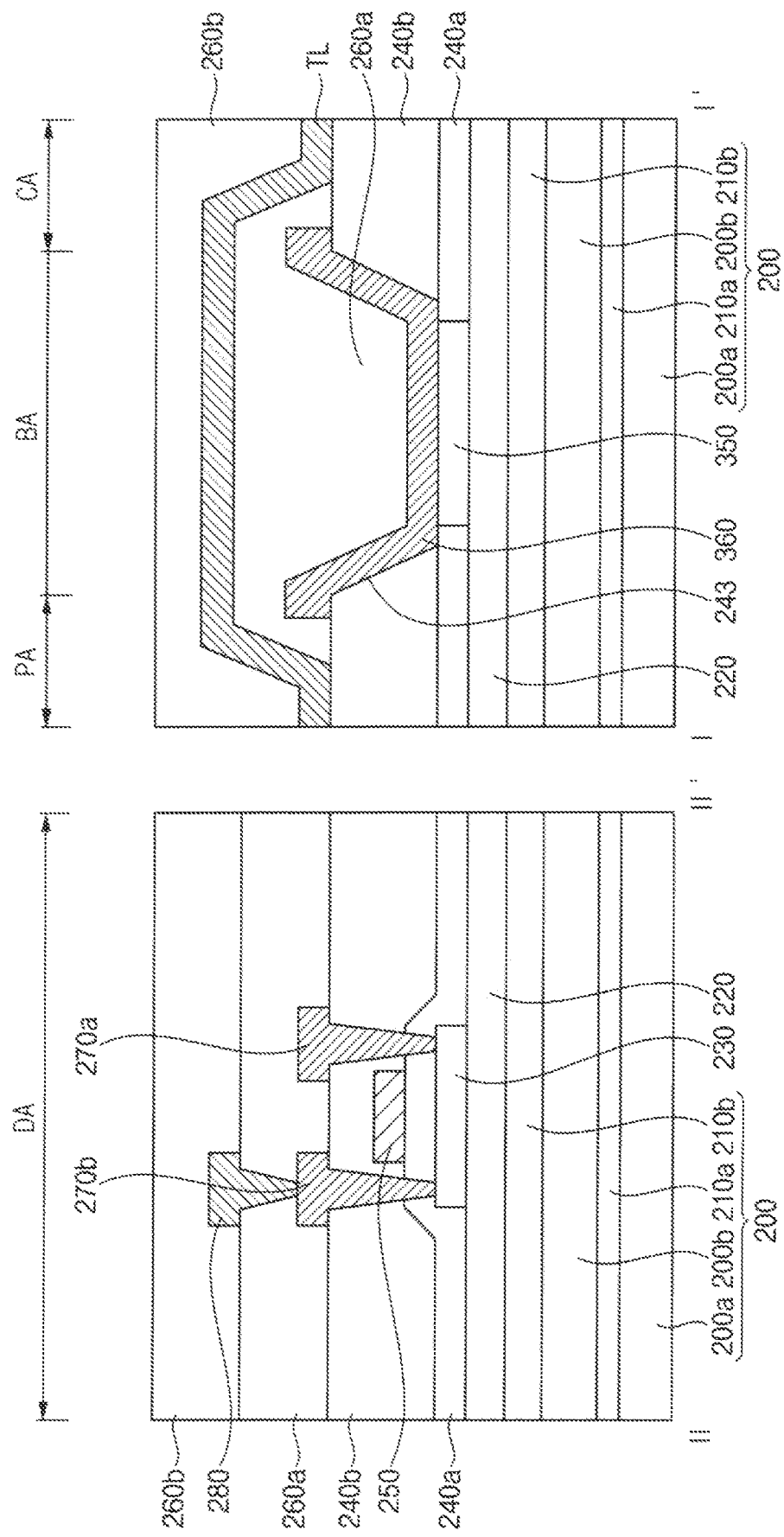

Referring to FIG. 10, the second organic layer 260b may be formed on the first organic layer 260a and the connection electrode 280 disposed in the display area DA and the transmission line TL disposed in the bending area BA. That is, the second organic layer 260b may be entirely formed in the display area DA, the peripheral area PA, the bending area BA, and the connection area CA. The second organic layer 260b positioned in the display area DA may be formed to cover the connection electrode 280. For example, the second organic layer 260b may include an organic insulating material such as phenol resin, acrylic resin, polyimide resin, polyamide resin, siloxane resin, epoxy resin, etc.

Referring to FIG. 11, a pixel contact hole may be formed in the second organic layer to expose the connection electrode 280. The lower electrode 290 may be formed in the display area DA on the second organic layer 260b. The lower electrode 290 may be connected to the connection electrode 280 through the pixel contact hole. For example, the lower electrode 290 may be formed using a metal, an alloy, a metal nitride, a conductive metal oxide, a transparent conductive material, and the like.

The pixel defining layer 310 may be formed on the second organic layer 260b on the lower electrode 290. The pixel defining layer 310 may have an opening exposing at least a part of the lower electrode 290 in the display area DA. For example, the pixel defining layer 310 may be made of an organic material or an inorganic material. According to an embodiment, the pixel defining layer 310 may be formed using the organic material.

The emission layer 320 may be formed on exposed portion of the lower electrode 290. The light emitting layer 320 may include at least one functional layer of a hole injection layer, a hole transport layer, an electron transport layer, and an electron injection layer.

According to an embodiment, the emission layer 320 may emit red, green, or blue light. According to another embodiment, the emission layer 320 may emit white light. When the light emitting layer 320 emits white light, the light emitting layer 320 may include a multilayer structure including a red light emitting layer, a green light emitting layer, and a blue light emitting layer. Alternatively, the light emitting layer 320 may include a single layer structure including red, green, and blue light emitting materials.

The upper electrode 330 may be formed on the pixel defining layer 310 and the emission layer 320. The upper electrode 330 may cover the pixel defining layer 310 and the emission layer 320 in the display area DA. For example, the upper electrode 330 may include a metal, an alloy, a metal nitride, a metal fluoride, a conductive metal oxide, or a combination thereof. For example, the upper electrode 330 may continuously extend on the display area DA over the plurality of pixel areas PX shown in FIG. 1.

The encapsulation layer 340 may be formed on the upper electrode 330. For example, the encapsulation layer 340 may have a stacked structure of an inorganic thin film and an organic thin film. The encapsulation layer 340 may prevent the lower electrode 290, the pixel defining layer 310, and the upper electrode 330 from deteriorating due to penetration of moisture or oxygen. In addition, the encapsulation layer 340 may also perform a function of protecting the lower electrode 290, the pixel defining layer 310, and the upper electrode 330 from external impact.

For example, the organic thin film may be formed using a cured polymer such as polyacrylate, epoxy resin, silicone resin, and the like. For example, the inorganic thin film may be formed using silicon oxide, silicon nitride, silicon carbide, aluminum oxide, tantalum oxide, hafnium oxide, zirconium oxide, titanium oxide, and the like.

Accordingly, the display device 100 of FIG. 1 may be fabricated.

In the method of fabricating the display device 100 according to an embodiment, the process of removing the inorganic layer in the bending area BA may be performed at the same time with a process forming the source contact hole and the drain contact hole in the display area DA without using a separated masking process and the second dummy pattern 360 may be formed at the same time with the process of forming the source electrode 270a and the drain electrode 270b to contact the exposed upper surface of the first dummy pattern 350. Accordingly, the manufacturing cost of the display device 100 may be reduced, and the first dummy pattern 350 and the second dummy pattern 360 may block the propagation of the crack generated in the inorganic layer to the transmission line TL.

FIG. 12 is a cross-sectional view taken along lines I-I' and II-II' corresponding to another example of the display device of FIG. 1.

Referring to FIG. 12, a display device 101 may include a first organic film 200a, a second organic film 200b, a first barrier layer 210a, a second barrier layer 210b, a buffer layer 220, an active layer 230, a gate electrode 250, a first insulating layer 240a, a second insulating layer 240b, a source electrode 270a, a drain electrode 270b, a connection electrode 280, a first organic layer 260a, a second organic layer 260b, a lower electrode 290, a pixel defining layer 310, an upper electrode 330, an emission layer 320, an encapsulation layer 340, a first dummy pattern 350, a second dummy pattern 360, a transmission line TL, and the like. The display device 101 may be substantially the same as the display device 100 described with reference to FIG. 4 except for a contact area of the first dummy pattern 350 and the second dummy pattern 360. Hereinafter, the first dummy pattern 350 and the second dummy pattern 360 will be mainly described.

The first dummy pattern 350 may be disposed in the bending area BA on the buffer layer 220. According to an embodiment, the first dummy pattern 350 may be disposed in a part of the bending area BA. According to another embodiment, the first dummy pattern 350 may be entirely disposed in the bending area BA.

The second dummy pattern 360 may contact the exposed upper surface of the first dummy pattern 350. According to an embodiment, the entire exposed upper surface of the first dummy pattern 350 may contact the lower surface of the second dummy pattern 360. Accordingly, the second dummy pattern 360 may be strongly adhered to the buffer layer 220 via the first dummy pattern 350.

The display device 101 according to an embodiment, the first dummy pattern 350 including polysilicon may be disposed in the bending area BA on the buffer layer 220, and the first dummy pattern 350 may be disposed in a part of the area BA, and the entire exposed upper surface of the first dummy pattern 350 may direct contact the lower surface of the second dummy pattern 360. Accordingly, the first dummy pattern 350 and the second dummy pattern 360 may block the propagation of the crack generated in the inorganic layer to the transmission line TL and may minimize the concentration of the tensile stress on the transmission line TL.

FIG. 13 is a cross-sectional view taken along lines I-I' and II-II' corresponding to still another example of the display device of FIG. 1.

Referring to FIG. 13, a display device 102 may include a first organic film 200a, a second organic film 200b, a first barrier layer 210a, a second barrier layer 210b, a buffer layer 220, an active layer 230, a gate electrode 250, a first insulating layer 240a, a second insulating layer 240b, a source electrode 270a, a drain electrode 270b, a connection electrode 280, a first organic layer 260a, a second organic layer 260b, a lower electrode 290, a pixel defining layer 310, an upper electrode 330, an emission layer 320, an encapsulation layer 340, a first dummy pattern 350, a second dummy pattern 360, a transmission line TL, and the like. The display device 102 may be substantially the same as the display device 100 described with reference to FIG. 4 except for a contact area of the first dummy pattern 350 and the second dummy pattern 360. Hereinafter, the first dummy pattern 350 and the second dummy pattern 360 will be mainly described.

The first dummy pattern 350 may be disposed in the bending area BA on the buffer layer 220. According to an embodiment, the first dummy pattern 350 may be entirely disposed in the bending area BA. According to another embodiment, the first dummy pattern 350 may extend as a part of the peripheral area PA and a part of the connection area CA.

The second dummy pattern 360 may contact the exposed upper surface of the first dummy pattern 350. According to an embodiment, the exposed upper surface of the first dummy pattern 350 may contact the entire lower surface of the second dummy pattern 360. Accordingly, adhesion of the second dummy pattern 360 and the buffer layer 220 may be further strengthened.

In the display device 102 according to an embodiment, the first dummy pattern 350 including polysilicon may be disposed in the bending area BA on the buffer layer 220, and the first dummy pattern 350 may be entirely disposed in the area BA, and the entire exposed upper surface of the first dummy pattern 350 may contact the lower surface of the second dummy pattern 360. Accordingly, the first dummy pattern 350 and the second dummy pattern 360 may block the propagation of the crack generated in the inorganic layer to the transmission line TL and may minimize the concentration of the tensile stress on the transmission line TL.

The present inventive concept may be applied to various display devices that may include an organic light emitting display device. For example, the present inventive concept may be applicable to numerous display devices such as display devices for vehicles, ships and aircraft, portable communication devices, display devices for exhibition or information transmission, medical display devices, and the like.

Although certain embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A display device comprising:
    a substrate including a display area and a bending area;
    a buffer layer disposed on the substrate;
    a first dummy pattern disposed in the bending area on the buffer layer;
    a first insulating layer disposed on the buffer layer, the first insulating layer exposing an upper surface of the first dummy pattern;
    a second insulating layer disposed on the first insulating layer, the second insulating layer having an opening exposing an upper surface of the first dummy pattern;
    a second dummy pattern disposed on the first dummy pattern; and
    a transmission line disposed on the second dummy pattern to overlap the second dummy pattern in a thickness direction.

2. The display device of claim 1, wherein the substrate includes:
    a first organic film;

a first barrier layer disposed on the first organic film;
a second organic film disposed on the first barrier layer; and
a second barrier layer disposed on the second organic film.

3. The display device of claim 1, further comprising:
a source electrode and a drain electrode disposed in the display area on the second insulating layer,
wherein a material included in the second dummy pattern is identical to a material included in each of the source and drain electrodes.

4. The display device of claim 1, wherein the second dummy pattern contacts an upper surface of the first dummy pattern.

5. The display device of claim 4, wherein the substrate further includes:
a peripheral area disposed between the display area and the bending area; and
a connection area disposed adjacent to the bending area, and
wherein the second dummy pattern extends from an edge of the peripheral area to an edge of the connection area.

6. The display device of claim 4, further comprising:
a first organic layer disposed on the second dummy pattern.

7. The display device of claim 1, further comprising:
a second organic layer disposed on the transmission line.

8. The display device of claim 7, further comprising:
a lower electrode disposed in the display area on the second organic layer;
an emission layer disposed on the lower electrode; and
an upper electrode disposed on the emission layer.

9. The display device of claim 1, further comprising:
an active layer disposed in the display area on the buffer layer,
wherein a material included in the first dummy pattern is identical to a material included in the active layer.

10. The display device of claim 9, wherein the first dummy pattern includes a silicon semiconductor.

11. The display device of claim 1, wherein the first dummy pattern includes polysilicon.

12. A display device comprising:
a substrate including a display area and a non-display area;
a buffer layer disposed on the substrate in the display area and the non-display area;
a first dummy pattern disposed in the non-display area on the buffer layer, the first dummy pattern being electrically floated;
a first insulating layer disposed on the buffer layer, the first insulating layer exposing an upper surface of the first dummy pattern;
a second insulating layer disposed on the first insulating layer, the second insulating layer having an opening exposing the upper surface of the first dummy pattern;
a second dummy pattern disposed on the first dummy pattern; and
a transmission line disposed on the second dummy pattern to overlap the second dummy pattern in a thickness direction.

13. The display device of claim 12, wherein the display device further comprising a thin film transistor, the thin film transistor including:
an active layer;
a gate electrode overlapping the active layer with the first insulating layer disposed between the active layer and the gate electrode; and
a source electrode and a drain electrode connected to the active layer via contact holes formed through the first insulating layer and the second insulating layer, and
wherein the first dummy pattern is disposed on a same layer as the active layer and formed of a same material as the active layer.

14. The display device of claim 13, wherein the second dummy pattern directly contacts the first dummy pattern.

15. The display device of claim 14, wherein the second dummy pattern is disposed on a same layer as the source electrode and the drain electrode and formed of a same material as the source electrode and the drain electrode.

* * * * *